(12) United States Patent
Totzeck

(10) Patent No.: US 8,593,618 B2
(45) Date of Patent: Nov. 26, 2013

(54) OPTICAL SYSTEM OF A MICROLITHOGRAPHIC PROJECTION EXPOSURE APPARATUS AND MICROLITHOGRAPHIC EXPOSURE METHOD

(75) Inventor: Michael Totzeck, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 398 days.

(21) Appl. No.: 12/971,798

(22) Filed: Dec. 17, 2010

(65) Prior Publication Data

US 2011/0122391 A1  May 26, 2011

Related U.S. Application Data

(63) Continuation of application No. PCT/EP2008/057900, filed on Jun. 20, 2008.

(51) Int. Cl.
| | | |
|---|---|---|
| *G03B 27/54* | (2006.01) | |
| *G02B 5/30* | (2006.01) | |
| *G03F 7/20* | (2006.01) | |

(52) U.S. Cl.
CPC ........ *G03F 7/70191* (2013.01); *G03F 7/70125* (2013.01); *G03F 7/70566* (2013.01)
USPC ............... 355/71; 355/53; 355/67; 355/77; 359/485.06; 359/485.07

(58) Field of Classification Search
CPC ............ G03F 7/70958; G03F 7/70966; G03F 7/70566; G03F 7/70308; G03F 7/70316; G03F 7/70191; G03F 7/70125; G03F 7/70091
USPC ............... 355/53, 67, 71; 359/485.06, 485.07
See application file for complete search history.

(56) References Cited

U.S. PATENT DOCUMENTS

| | | | |
|---|---|---|---|
| 4,929,040 A | | 5/1990 | Pagano et al. |
| 5,048,926 A | * | 9/1991 | Tanimoto ................. 359/485.07 |
| 5,614,988 A | | 3/1997 | Kato et al. |
| 5,933,219 A | | 8/1999 | Unno |

(Continued)

FOREIGN PATENT DOCUMENTS

| | | |
|---|---|---|
| DE | 102005037764 A1 * | 2/2007 |
| JP | 61-296302 | 12/1986 |

(Continued)

OTHER PUBLICATIONS

The International Search Report and a Written Opinion from the counterpart PCT Application No. PCT/EP2008/057900, mailed Apr. 23, 2009.

(Continued)

*Primary Examiner* — Steven H Whitesell Gordon
(74) *Attorney, Agent, or Firm* — Fish & Richardson P.C.

(57) ABSTRACT

The disclosure relates to an optical system of a microlithographic projection exposure apparatus and to a microlithographic exposure method. An optical system of a microlithographic projection exposure apparatus includes an image rotator, which is arranged in the optical system such that light impinging on the image rotator is at least partially polarized. The image rotator rotates, for light impinging on the image rotator, both the intensity distribution and the polarization distribution of through a given angle of rotation.

18 Claims, 8 Drawing Sheets

(56) References Cited

U.S. PATENT DOCUMENTS

| | | | |
|---|---|---|---|
| 6,674,514 B2* | 1/2004 | Shinoda | 355/71 |
| 6,738,189 B1 | 5/2004 | Ulrich et al. | |
| 7,312,852 B2* | 12/2007 | Wagner et al. | 355/71 |
| 7,508,493 B2 | 3/2009 | Takeuchi et al. | |
| 8,081,295 B2 | 12/2011 | Goehnermeier | |
| 2005/0219494 A1* | 10/2005 | Mulder et al. | 355/67 |
| 2005/0264885 A1* | 12/2005 | Albert | 359/489 |
| 2006/0055834 A1* | 3/2006 | Tanitsu et al. | 349/5 |
| 2007/0058151 A1* | 3/2007 | Eurlings et al. | 355/71 |
| 2007/0222963 A1 | 9/2007 | Goto | |
| 2008/0123055 A1 | 5/2008 | Mori et al. | |

FOREIGN PATENT DOCUMENTS

| | | |
|---|---|---|
| JP | 3-295222 | 12/1991 |
| JP | 8-008177 | 1/1996 |
| JP | 2005-333001 | 12/2005 |
| JP | 2006-210471 | 8/2006 |
| JP | 2007-220767 | 8/2007 |
| JP | 2007-258575 | 10/2007 |
| JP | 2008-016516 | 1/2008 |
| JP | 2008-533728 | 8/2008 |
| WO | WO 98/28647 A2 | 7/1998 |
| WO | WO 2005/069081 | 7/2005 |
| WO | WO 2006/097135 | 9/2006 |
| WO | WO 2006/097135 A1 | 9/2006 |
| WO | WO 2008/074673 | 6/2008 |
| WO | WO 2008/119794 | 10/2008 |

OTHER PUBLICATIONS

Japanese Office Action, with English translation, for JP Appl No. 2011-513885, dated Sep. 7, 2012.

M.V. Berry, "Quantal phase factors accompanying adiabatic changes," Proceedings of the Royal Society of London, Series A (Mathematical and Physical Sciences), 1984, 392 (1802), pp. 45-57.

E.J. Galvez and C.D. Holmes, "Geometric phase of optical rotators," Journal of the Optical Society of America A (Optics, Image Science and Vision), 1999, 16(8), pp. 1981-1985).

E.J. Galvez et al., "Variable geometric-phase polarization rotators for the visible," Optics Communications, 1999, 171(1-3), pp. 7-13).

* cited by examiner

OPTICAL SYSTEM OF A MICROLITHOGRAPHIC PROJECTION EXPOSURE APPARATUS AND MICROLITHOGRAPHIC EXPOSURE METHOD

CROSS-REFERENCE TO RELATED APPLICATIONS

This application is a continuation of, and claims benefit under 35 USC 120 to, international application PCT/EP2008/057900, filed Jun. 20, 2008, the entire contents of which are incorporated herein.

FIELD

The disclosure relates to an optical system of a microlithographic projection exposure apparatus, as well as to a microlithographic exposure method.

BACKGROUND

Microlithography is used for the production of microstructured components such as for example integrated circuits or LCDs. The microlithography process is carried out in what is referred to as a projection exposure apparatus having an illumination system and a projection objective. The image of a mask (=reticle) illuminated via the illumination system is projected via the projection objective onto a substrate (for example a silicon wafer) which is coated with a light-sensitive layer (photoresist) and arranged in the image plane of the projection objective in order to transfer the mask structure onto the light-sensitive coating on the substrate.

Various approaches are known for specifically setting or correcting the polarization distribution in the illumination system or in the projection objective in order to optimize the imaging contrast. For example, in an imaging process with high apertures as can be realized in the immersion lithography, a preferred polarization distribution is configured such that the diffraction orders are tangentially polarized in the wafer plane in order to avoid a loss of contrast due to the so-called vector-effect. The expression "vector effect", which occurs in imaging processes with high apertures, is used to describe the situation in which the vector of the electric field has, in the image region, different directions for different diffraction orders even if the polarization state is the same, which results from the fact that the p-polarized components (TM-components) of the vector of the electric field are no longer parallel to each other, so that imaging contrast depends on the polarization state.

WO 2005/069081 A2 discloses a polarization-influencing optical element which includes an optically active crystal and involves a thickness profile which varies in the direction of the optical axis of the crystal, whereby for example a constant linear input polarization distribution can be transformed into a tangential output polarization distribution (in which the preferred polarization direction or the oscillation direction of the vector of the electric field is oriented in perpendicular relationship with the radius directed towards the optical system axis).

There are also situations where an adaptation or adjustment of the illumination setting (of the intensity distribution obtained in a given plane, in particular in a pupil plane) is desired. Examples are the rotation of the illumination poles of a dipole or quadrupole illumination setting about the optical axis (the adjustment or realization of a "rotated" dipole or quadrupole-setting), which may be favourable or desired in order to produce an image of oblique or inclined mask structures.

FIGS. 7a-d schematically illustrate such an adaptation of the illumination setting to an oblique or inclined mask structure 725 (in which the repetitive direction is rotated through an angle a with respect to the y-axis in the coordinate system or a mask structure 715 having only horizontal structures, respectively). In the dipole illumination setting 720 according to FIG. 7c realized in the illumination device, the illumination poles 721, 722 are also rotated through an angle α with respect to the y-axis in order to achieve an adaptation or matching with the mask structure 725 shown in FIG. 7d. However, a rotation of only the intensity distribution results in a situation in which, for the dipole illumination setting 710 according to FIG. 7a, a quasi-tangential polarization distribution is no longer present in case of rotation of the illumination poles 720, 721 in the dipole illumination setting 720 according to FIG. 7c, leading to a loss of the afore described optimization of contrast.

U.S. Pat. No. 5,614,988 discloses, among other things, a projection exposure apparatus having a plurality of projection optical units, where a matching between images formed through the respective projection optical units is achieved by rotating reflective surfaces in the projection optical units about the optical axis.

SUMMARY

The disclosure provides an optical system of a microlithographic projection exposure apparatus as well as a microlithographic exposure method, by which different illumination settings can be realized in such away that a loss in contrast can be reduced or avoided in the lithography process.

The disclosure provides an optical system of a microlithographic projection exposure apparatus that includes an image rotator arranged in the optical system such that light impinging on the image rotator is at least partially polarized. The image rotator rotates, for light impinging on the image rotator, both the intensity distribution and the polarization distribution of through a given angle of rotation.

The expression that light "impinging on the image rotator is at least partially polarized" is used to denote that light which impinges (during operation of the optical system) on the image rotator has a degree of polarization of at least 0.2 (e.g., at least 0.4, at least 0.6). Here, the degree of polarization is defined as the ratio of the intensity of the polarized light portion and the intensity of the overall light. Accordingly, for completely polarized light the degree of polarization amounts to one, for completely unpolarized light the degree of polarization amounts to zero, and for partially polarized light the degree of polarization has a value between zero and one.

The disclosure is based on the concept of, in an optical system of a microlithographic projection exposure apparatus, simultaneously rotating both the intensity distribution and the polarization distribution using an image rotator.

The fact that both the intensity distribution and the polarization distribution of light impinging (during operation of the optical system) on the image rotator are rotated affords the possibility to maintain the orientations of the preferred polarization direction in the light bundles which are interfering with each other during the lithography process (i.e. the ratio between s- and p-polarization) with respect to each other if compared to the situation prior to the rotation of the illumination poles. In particular, such a situation may arise if the illumination poles of a dipole illumination setting or a quadrupole illumination setting are simultaneously rotated in order to realize an adaptation or matching to different, for example oblique or inclined mask structures. For example, a so-called quasi-tangential polarization distribution which had been set for a mask structure having only horizontal and/or vertical structures, and the thereby obtained optimization of contrast for such a quasi-tangential polarization distribution, can be maintained.

In general, "tangential polarization distribution" denotes a polarization distribution in which the oscillation direction of the vector of the electric field is oriented in perpendicular relationship with the radius directed towards the optical system axis. A "quasi-tangential polarization distribution" denotes a polarization distribution wherein an illumination setting includes distinct illumination poles each having a constant polarization distribution, wherein the "center polarization" is tangentially oriented with respect to the boundary of the pupil and perpendicular to the radius (see double-headed arrow in FIGS. 6a and 6c).

Accordingly, the term "radial polarization distribution" is used to denote a polarization distribution wherein the oscillation direction of the vector of the electric field is oriented in the direction of the optical system axis. The expression "quasi-radial polarization distribution" is used to denote a polarization distribution wherein an illumination setting includes distinct illumination poles each having a constant polarization state, wherein the "center polarization" is oriented in parallel with the radius directed towards the optical system axis or perpendicular to the boundary of the pupil, respectively.

According to an embodiment, the image rotator includes at least two beam deflecting optical elements (e.g. prisms). These beam deflecting optical elements can be so configured that they are adjustable with respect to each other in order to change the angle of rotation.

According to an embodiment, at least one prism includes a crystalline material. Due to the use of a crystalline material, compaction effects which arise e.g. in connection with an amorphous material such as fused silica can be avoided. According to an embodiment using cubic crystalline material, the crystal structure of this material is such that a light beam which is refracted when entering the prism propagates either in the <100>-direction or in the <111>-direction of the cubic crystalline material. Thereby the effect of the intrinsic birefringence and a non-desired polarization effect can be minimized.

According to a further aspect, the disclosure also relates to an illumination system of a microlithographic projection exposure apparatus. The illumination system includes an image rotator which rotates, for light impinging on the image rotator, both the intensity distribution and the polarization distribution through a given angle of rotation. According to this aspect, the disclosure is not restricted to an irradiation of the image rotator with at least partially polarized light, but also includes arrangements of the image rotator in the illumination device wherein unpolarized light impinges on the image rotator.

The disclosure also relates to a microlithographic projection exposure apparatus having an illumination system and a projection objective. The illumination system and/or the projection objective include an optical system as described above, or the illumination device is configured as described above.

In the case of the realization of the disclosure in the illumination system, an adaptation or matching to different, for example oblique or inclined mask structures can be achieved, as described before, while optimizing the contrast. The image rotator can be arranged in a pupil plane in order to effect a rotation of the illumination setting including the polarization distribution. Furthermore, a rotation of the illumination field can be effected if the image rotator is arranged in a field plane of the illumination system.

If the image rotator is placed in the projection objective, it is possible for example during the imaging of several different mask structures that each mask structure is used in combination with the optimum intensity distribution and polarization distribution, if the respective diffraction orders are rotated about the optical axis. Furthermore, a rotation of the image field in order to achieve an azimuthal orientation of the image field can be realized if the image rotator is placed in a field plane of the projection objective.

The disclosure can be realized with particular advantage in connection with a projection objective having a relatively large numerical aperture, since in this case the imaging contrast is strongly dependent on the polarization state of the light beams interfering with each other. According to an embodiment, the projection objective has a numerical aperture of more than 0.85, such as more than 1.1. Furthermore, the microlithographic projection exposure apparatus is configured to be operated in an immersion mode.

The disclosure can in particular be realized in a process which is also referred to as "double exposure" or "double patterning". In this process the wafer is exposed in different projection steps (which may e.g. be directly subsequent to each other) using different mask structures.

Further advantages of using of the image rotator in the projection objective arise if several masks are simultaneously exposed. In such a case it may be desired, with regard to the contrast being obtained in the imaging process, that the images of the mask which are simultaneously produced in the photoresist are aligned to each other in an optimum way. If the mask structures are aligned different from each other, for example for reasons of design, the images of the mask can be "rotated back", using the image rotator of the disclosure, with respect to both the intensity distribution and the polarization distribution prior to impinging on the photoresist. In this way, a misalignment can be compensated by the image rotator without the imaging contrast being deteriorated. An overall optimization of the imaging contrast is thereby obtained.

The disclosure also provides to a microlithographic projection exposure method. The method includes providing a substrate to which a layer of a light-sensitive material is at least partially applied, and providing a microlithographic projection exposure apparatus having an illumination system and a projection objective. The method also includes projecting at least two different mask structures onto a region of the layer via the projection exposure apparatus. For light impinging on one of these mask structures, both the intensity distribution and the polarization distribution are rotated by an image rotator with respect to light impinging on the other one of these mask structures.

According to an embodiment of the method, a mask structure to be projected onto the light-sensitive layer is changed between projection steps performed at different times (wherein the projection steps can be directly subsequent to each other, or wherein one or more further projection steps can be performed in between). Due to the use of the image rotator of the disclosure, an optimum contrast can be maintained by simultaneously rotating the intensity distribution and the polarization distribution for the respective mask structure to be projected onto the light-sensitive layer, since each mask structure can be used in combination with the optimum intensity distribution and polarization distribution. The adaptation or matching of the intensity distribution and the polarization distribution effected by the image rotator to the respective mask structure can in particular be realized without an intermediate exchange of a diffractive optical element (DOE) as well as without exchange of other polarization-modifying optical elements.

According to a further embodiment, the projecting of the at least two different mask structures is performed such that these mask structures are simultaneously projected, and according to a further embodiment, onto the same region of the layer, wherein the projecting can in particular be performed using different projection objectives.

Further configurations of the disclosure can be gathered from the description and also the subclaims.

BRIEF DESCRIPTION OF THE DRAWINGS

The disclosure is explained in more detail below on the basis of exemplary embodiments illustrated in the accompanying figures, in which.

DETAILED DESCRIPTION

Figure 1:
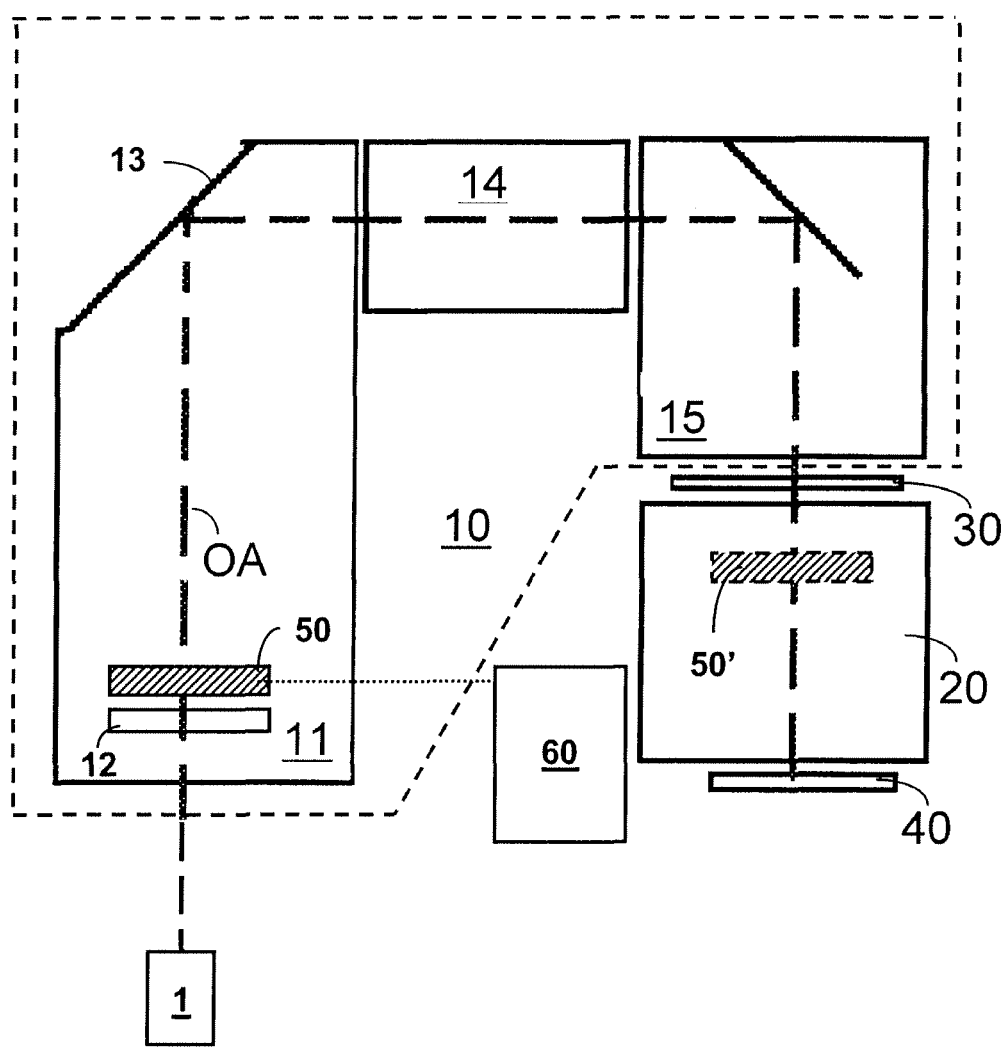
FIG. 1 shows a schematic illustration of the structure of a microlithographic projection exposure apparatus having an optical system in accordance with an embodiment of the present disclosure.

FIG. 1 is a diagrammatic view showing the structure in principle of a microlithographic exposure apparatus having an optical system in accordance with an embodiment of the disclosure, wherein the exposure apparatus includes an illumination system 10 and a projection objective 20. The illumination system 10 serves for the illumination of a structure-bearing mask (reticle) 30 with light from a light source unit 1 which includes for example a KrF laser for a working wavelength of 248 nm or an ArF laser for a working wavelength of 193 nm or an $F_2$ laser for a working wavelength of 157 nm or an EUV source for a working wavelength of roughly 13 nm, and a beam-forming optical system generating a parallel light beam.

The illumination system 10 includes an optical unit 11 in which the light from the light source unit 1 firstly impinges on a diffractive optical element (DOE) 12. The DOE 12 produces, in a pupil plane of the illumination system, a desired intensity distribution (for example a dipole or quadrupole illumination setting) by way of an angular radiation characteristic defined by the respective diffracting surface structure.

The optical unit 11 can furthermore include an arrangement (not shown) of a zoom objective and an axicon. Different illumination configurations are produced via the zoom objective in conjunction with the upstream-disposed diffractive optical element 12 in the pupil plane, depending on the respective zoom position and position of the axicon elements. The optical unit 11 further includes, in the illustrated example, a direction-changing mirror 13. Disposed downstream of the optical unit 11 in the light propagation direction in the beam path is a light mixing device (not shown) which in per se known manner has an arrangement including microoptical elements suitable for producing a light mixture. The light mixing device is followed in the light propagation direction by a lens group 14, downstream of which is a field plane with a reticle masking system (REMA), the image of which is produced on the structure-bearing mask (reticle) 30 arranged in a further field plane by a REMA objective 15 at a downstream position in the light propagation direction, and which thereby delimits the illuminated region on the mask 30. The structure-bearing mask 30 is imaged with the projection objective 20 onto a wafer or a substrate 40 provided with a light-sensitive layer.

In accordance with FIG. 1, the illumination system 10 further includes an image rotator 50, which is described in more detail in the following with reference to FIG. 2-6. The image rotator 50 is irradiated with light which is at least partially polarized, and effects a simultaneous rotation of both the intensity distribution and the polarization distribution of this light.

FIG. 1 also schematically shows a control unit (or driving unit) 60 to control an adjustment of this rotation (e.g. via appropriate actuators). The image rotator 50 includes at least two beam deflecting optical elements, which are adjustable with respect to each other in order to modify the angle of rotation effected by the image rotator 50.

An image rotator 50' can be provided (as alternative or in addition to the image rotator 50) in the projection objective 20, as schematically shown by dashed lines in FIG. 1.

In the following, a general concept of the present disclosure is described with reference to FIG. 2.

Figure 2:
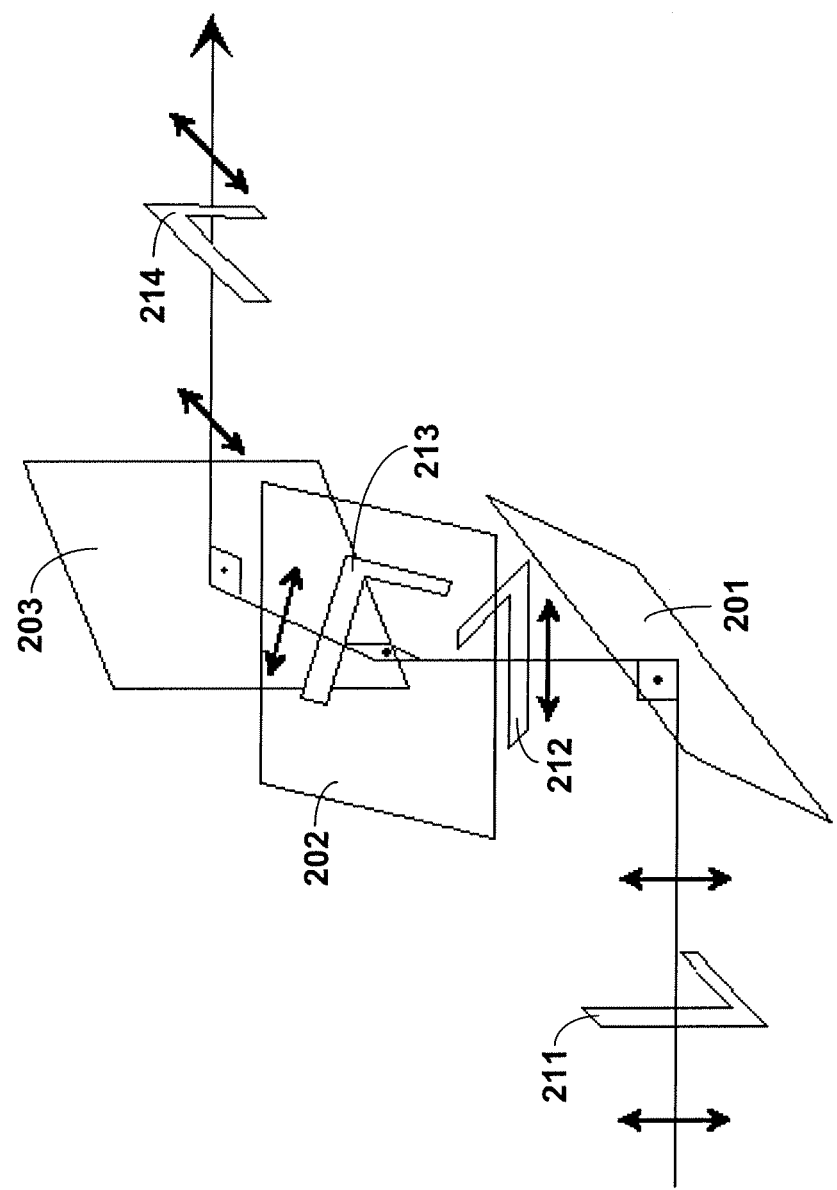
FIG. 2 shows a schematic illustration for elucidating the effect of an image rotator according to the disclosure.

FIG. 2 shows how a rotation of both the intensity distribution and the polarization distribution is achieved using an arrangement of three mirrors 201, 202 and 203, wherein the coordinate system of the beam is geometrically rotated about an axis. In order to illustrate this rotation, the respective intensity distribution is schematically shown and designated with "211" upstream of the first mirror 201, with "212" between the first mirror 201 and the second mirror 202, with "213" between the second mirror 202 and the third mirror 203, and with "214" downstream of the third mirror 203. The respective preferred polarization direction is symbolized by double-headed arrows. It can be seen that both the intensity distribution and the polarization distribution are simultaneously rotated by the same angle of rotation.

As a result, a simultaneous rotation of both the intensity distribution and the polarization distribution is achieved due to the image rotator. As a consequence of the odd number of mirrors, an inversion or a reversion, respectively, of the image is achieved when using the arrangement of FIG. 2. Such an effect is not achieved if an even number of mirrors is used.

Figure 7:
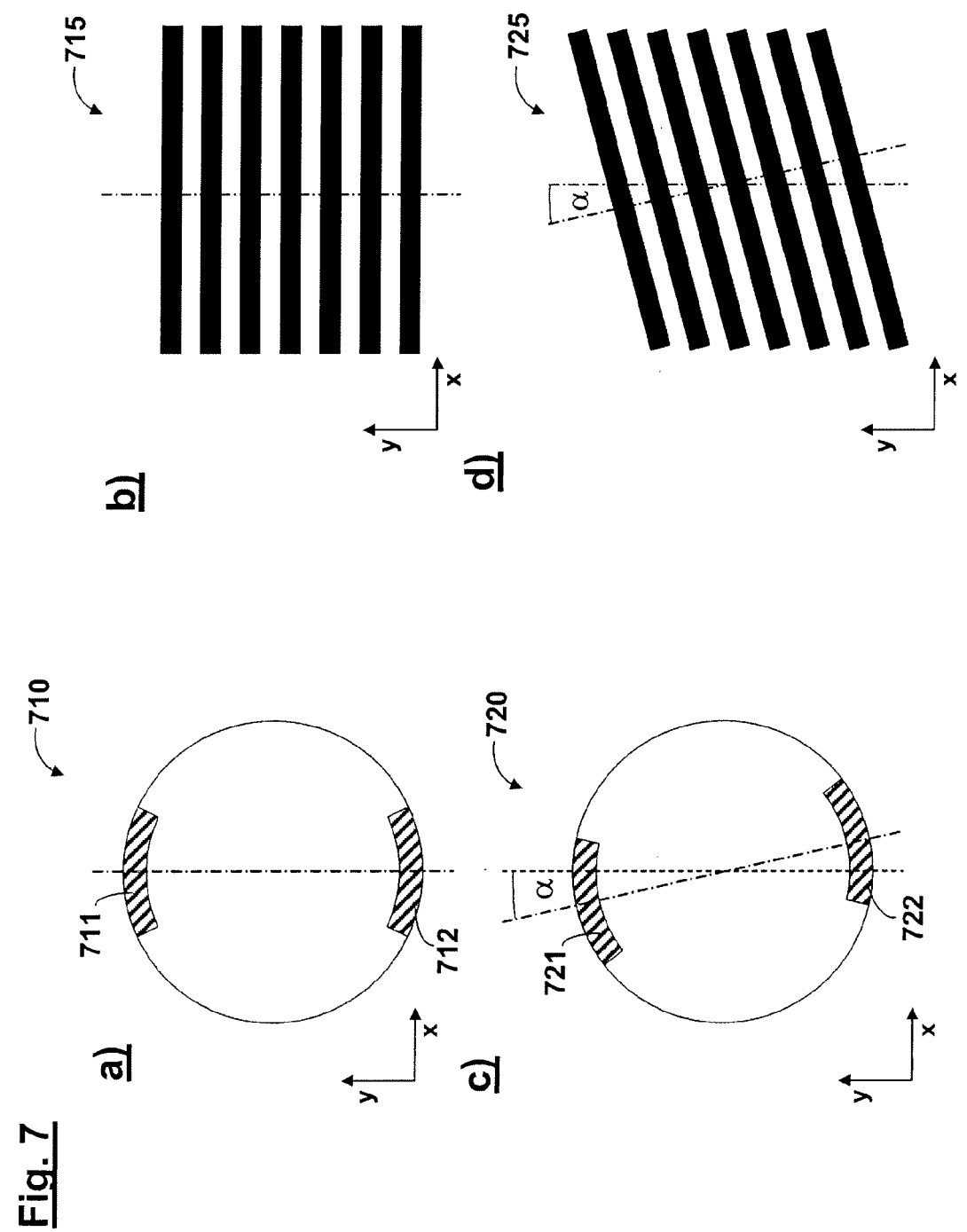
FIGS. 7a-d show schematic illustrations of illumination settings having illumination poles with different angles of rotation, and also shows schematic illustrations of masks being used in combination with the illumination settings.

FIG. 6a-d illustrates the implementation of this principle in a projection exposure apparatus. This figure shows, similar to FIG. 7, the adjustment of a dipole illumination setting to an oblique mask structure 625 (in which the repetitive direction is rotated by an angle α with respect to the y-axis in the coordinate system or with respect to a mask structure 650, respectively which only has horizontal structures). According to FIG. 6c, the illumination poles 621 and 622 are, in the dipole illumination setting 620 being adjusted in the illumination device, also rotated by an angle a with respect to the y-axis in order to achieve a matching or adaptation with the mask structure 625 of FIG. 6d. In contrast to the situation of FIG. 7, the relation between the axes of symmetry of the intensity distribution, on the one hand, and the polarization distribution, on the other hand, are maintained as a consequence of the fact that the polarization distribution (the preferred polarization direction being symbolized by double-headed arrows) is simultaneously rotated, too. With other words, even after rotation of the intensity distribution in accordance with FIG. 6c, a quasi-tangential polarization distribution and thereby an optimization of the contrast are obtained.

In a theoretical description of the concept of the present disclosure, the geometric phase utilized by the present disclosure is a consequence of the parallel transport in curved topologies, being defined by the system parameters, which manifests itself particularly clearly (but non-exclusive) if the respective physical system follows a closed path C in the parameter space. The geometric phase is the (solid) angle $\Omega$ which is enclosed by the path or curve C. The geometric phase is also referred to as "Berry phase" and is described, for quantum-mechanical systems, in M. V. Berry "Quantal phase factors accompanying adiabatic changes", Proceedings of the Royal Society of London, Series A (Mathematical and Physical Sciences), 1984, 392 (1802), pages 45-57. The sign of the geometric phase results from the running direction. The complete sphere corresponds to the geometric phase $\Omega$. For optical rotators, the parameter space is a modified Ewald sphere, the helicity sphere (see (vgl. E. J. Galvez and C. D. Holmes, "Geometric phase of optical rotators", Journal of the Optical Society of America A (Optics, Image Science and Vision), 1999, 16(8), pages 1981-1985).

Figure 8:
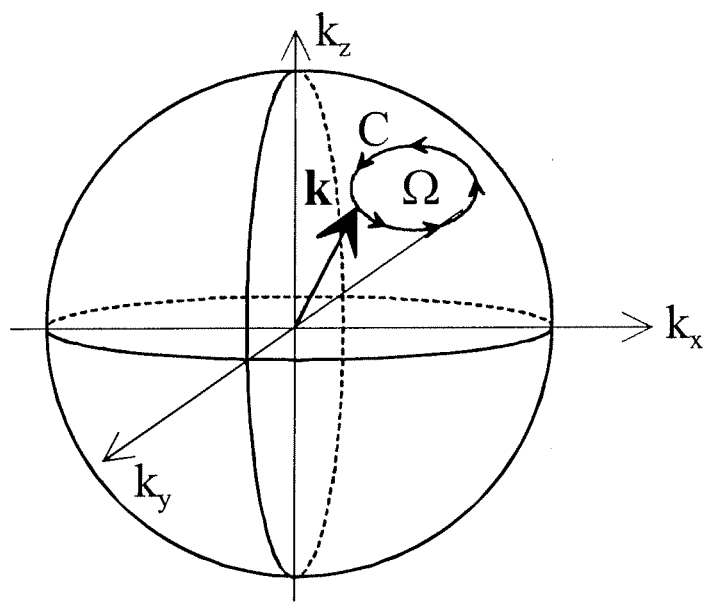
FIG. 8 shows a diagram used to theoretically describe the concept of the present disclosure, wherein a closed curve on the helicity sphere is illustrated.

FIG. 8 shows a closed curve or path C on the helicity sphere. The helicity vector h is defined using the propagation vector k and the number of reflections j according to equation (1):

$$\vec{h} = (-1)^j \vec{k} \quad (1)$$

For an even number of reflections, the vector h is therefore parallel to the propagation vector k, whereas for an odd number of reflections, the vector h is anti-parallel to the propagation vector k. It is also known in the prior art that a geometric phase on the helicity sphere rotates a linear polarization state through the same value (see E. J. Galvez et al. "Variable geometric-phase polarization rotators for the visible", Optics Communications, 1999, 171(1-3), pages 7-13).

Exemplary embodiments of an image rotator are described in the following and with reference to FIG. 3-5.

Figure 3:
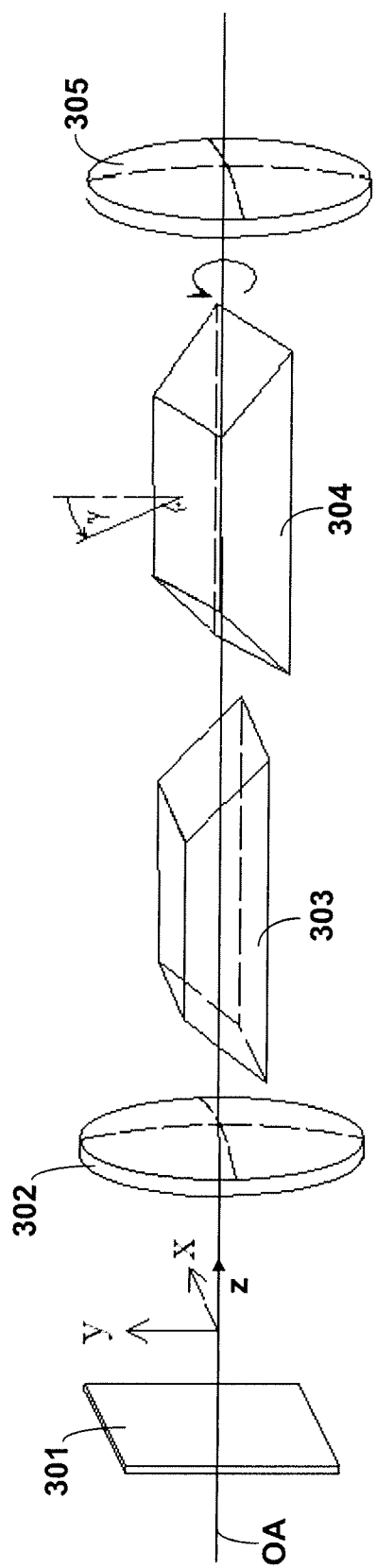
FIGS. 3-5 show schematic illustrations for elucidating the structure of an image rotator according further embodiments of the disclosure.

In accordance with FIG. 3, linearly polarized collimated laser radiation (having a cross-section of the beam of e.g. 20 mm) impinges on a diffractive optical element (DOE) 301 and is split in two partial bundles according to the dipole-angle characteristic, wherein the enclosed angle can e.g. amount to 5°. After the collimation by a lens 302, the bundle impinges on a combination of two prisms 303 and 304 which are rotated with respect to each other through an angle $\gamma$. These prisms are also referred to as dove-prisms and are forming the image rotator according to the present embodiment. Due to the variation of the angle $\gamma$, the angle of rotation can be adjusted in order to rotate both the intensity distribution and the polarization distribution.

Accordingly, the image rotator includes, in the embodiment of FIG. 3, the two prisms 303 and 304. The lenses 302 and 305 are optional. These lenses can effect, if desired, a collimation or can produce a parallel beam path at the position of the prisms 303 and 304. In particular, the DOE 301 can be arranged in the front or first focal plane of the lens 302, whereas the plane between the two prisms 303 and 304 can be arranged in the rear or second focal plane of the lens 302 and in the front or first focal plane of the lens 305.

According to FIG. 3, the first prism 303 is aligned parallel to the x-axis (referred to the base edge), and the second prism 304 is rotated, with respect to the first prism 303, through an angle $\gamma$.

In order to enclose on the helicity sphere an area which is larger than zero, it is important that a light beam propagates not only in one plane, since beam propagation in only one plane would only result in a (straight) line on the helicity sphere. With other words, the beam propagation should also take place in the "third dimension". This effect is achieved, in the example of the image rotator or the prism arrangement, respectively, shown in FIG. 3, by a rotation of one of the prisms with respect to the other prism about the optical axis through an angle $\gamma$. In E. J. Galvez and C. D. Holmes, "Geometric phase of optical rotators", Journal of the Optical Society of America A (Optics, Image Science and Vision), 1999, 16(8), pages 1981-1985 it is shown that the achieved image rotation amounts to 360°-2$\gamma$. If the given angle of rotation, through which both the intensity distribution and the polarization distribution are rotated due to the image rotator, is designated with $\alpha$, and if the angle of rotation of the second prism 304 with respect to the first prism 303 (e.g. referred to the base edges of the prisms) in FIGS. 3 and 4 is designated as $\gamma$ the following relation is valid:

$$\alpha = 360° - 2\gamma \quad (2)$$

The angle of rotation $\alpha$ which is adjusted by the image rotator can principally have any desired value, wherein, depending on the application or the used illumination settings, respectively, preferred angles of rotation can e.g. be 90°, 45° or 22.5°.

In the embodiment of FIG. 3, the prisms 303 and 304 are made of a cubic crystalline material (e.g. calcium fluoride, $CaF_2$). According to an embodiment, the crystal orientation of the crystal material is such that the refracted beam propagates, in the cubic crystalline material, either at least substantially in the <100>-direction or at least substantially in the <111>-direction, since in this case the intrinsic birefringence and the change of polarization due to the cubic crystalline material are minimized. In particular, the optical system axis can be orientated such that it is aligned with the <110>-direction, since in that case a beam propagation along the <100>-direction in the cubic crystalline material is obtained.

Figure 4:
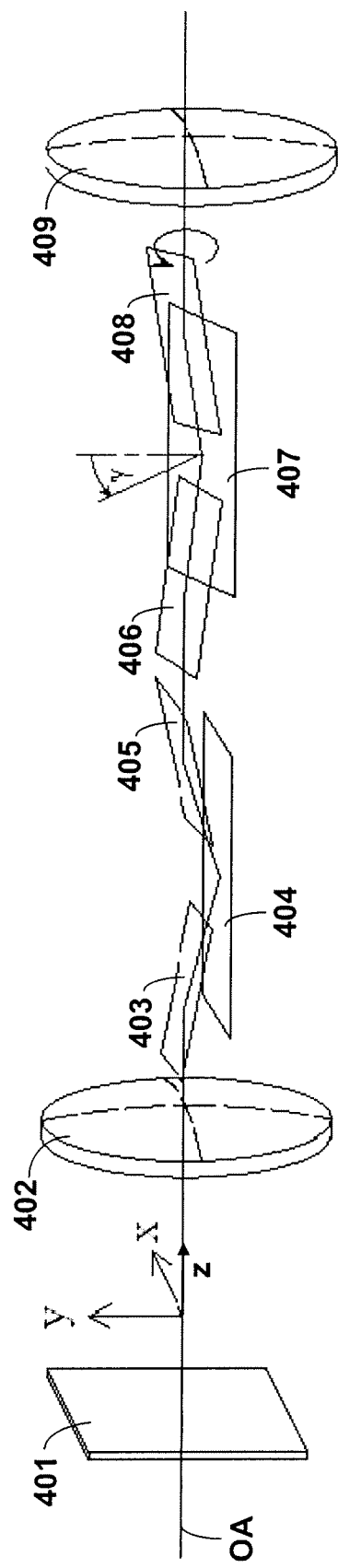

FIG. 4 shows a further embodiment of an image rotator in an illumination system in order to adjust a polarized dipole illumination setting having illumination poles that are rotated by an angle $\gamma$, wherein the prisms 303 and 304 of FIG. 3 are replaced by mirror groups each including three mirrors 403-405 or 406-408, respectively. In this case, the mirror group of mirrors 406-408 is rotated through an angle $\gamma$ with respect to the mirror group of mirrors 403-405 (if referred to the direction of the mirror surface normal 404 or 407, respectively). Accordingly, the image rotator includes, in the embodiment of FIG. 4, the mirror groups which each include three mirrors 403-405 or 406-408, respectively. The lenses 402 and 409 are optional and effect, if desired, a collimation or produce a beam propagation which is parallel at the position of the mirror groups. The angle of rotation $\alpha$ being adjusted by the image rotator according to FIG. 4 in dependence on the angle $\gamma$, through which the mirror group of mirrors 406-408 is rotated with respect to the mirror group of mirrors 403-405 (referred to the direction of the mirror surface normal 404 or 407, respectively) is again given by the above relation (2).

Figure 5:
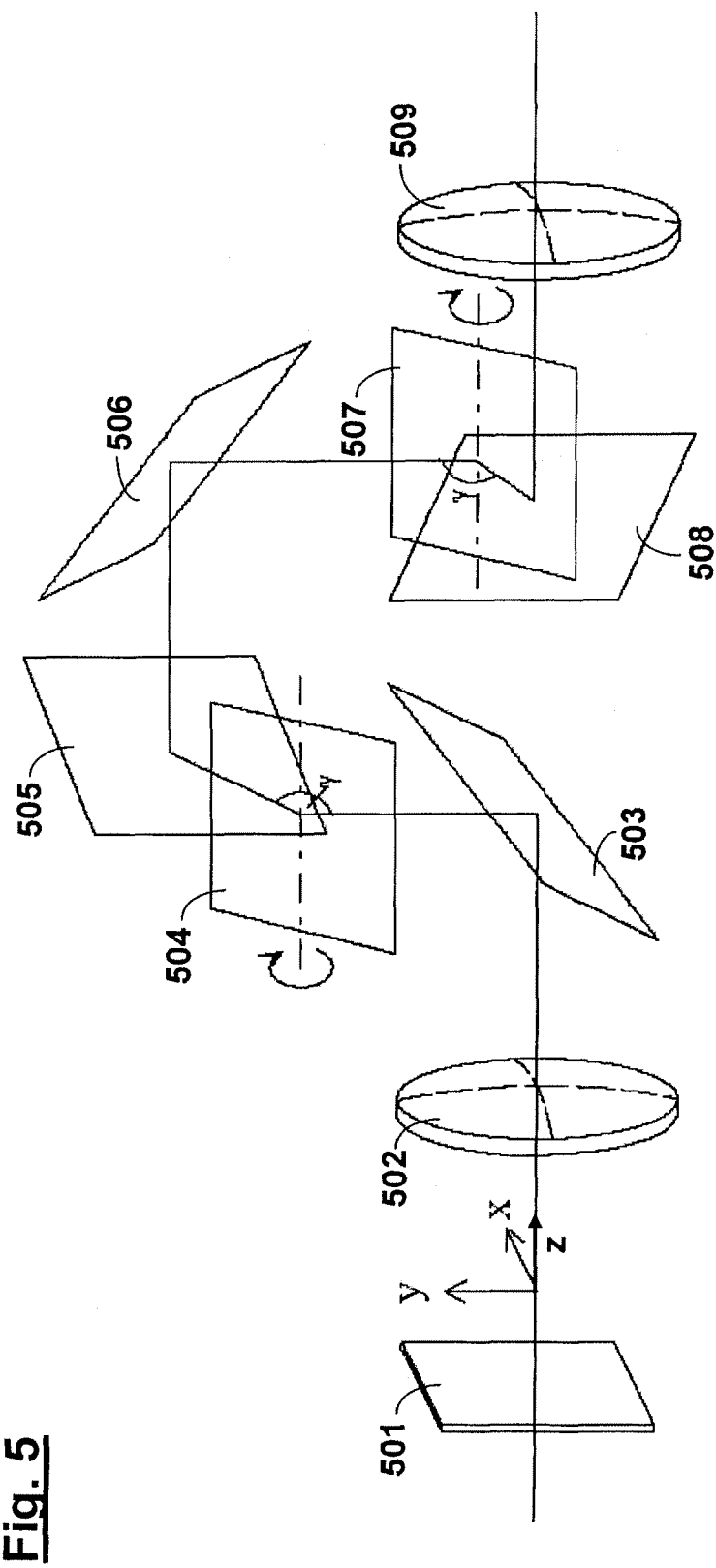
Figure 6:
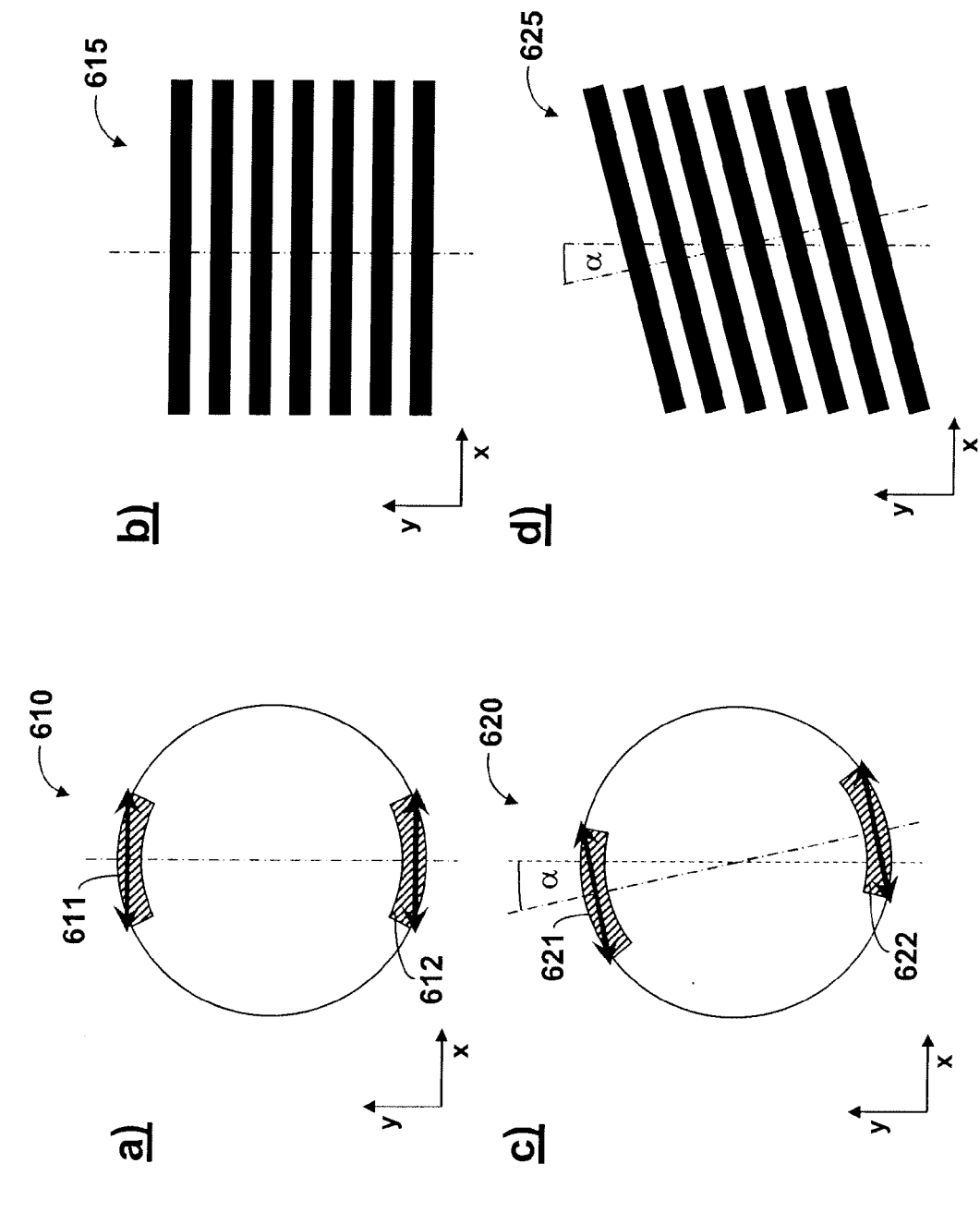
FIGS. 6a-d show further schematic illustrations for elucidating the effect of an image rotator according to the disclosure.

FIG. 5 shows a further embodiment of an image rotator in an illumination system. According to FIG. 5, linear polarized, collimated laser irradiation (having a beam cross section of e.g. 20 mm) impinges on a DOE 501 and is split in two partial bundles in accordance with a dipole angular characteristic, wherein the angle can again amount to e.g. 5°. After collimation of a lens 502, the light bundle impinges on a mirror arrangement of mirrors 503-508. The first mirror 503 deflects the chief ray through 90°. The second mirror 504 is rotated with respect to the x-axis through an angle γ and deflects the chief ray towards a combination of the two mirrors 505 and 506. After reflection at the mirror 507 and deflection through an angle γ, the mirror 508 again directs the chief ray in a direction along the optical axis or the z-direction, respectively.

Accordingly, the image rotator includes, in the embodiment of FIG. 5, the mirrors 503-508. The lenses 502 and 509 are optional and effect, if desired, a collimation or produce a parallel beam propagation at the position of the mirrors 503-508. The DOE 501 can be arranged in the front or first focal plane of lens 502, and a plane between the two mirrors 505 and 506 is located in the rear or second focal plane of lens 502 and in the front or first focal plane of lens 509. The mirror movements in the arrangement of FIG. 5, in order to effect a simultaneous rotation of the intensity distribution and the polarization distribution, include a rotation of the mirrors 504 and 507. In general, additional mirror movements are involved in order to again direct the chief ray into a direction along the optical axis or the z-direction, respectively.

Even though the disclosure has been described on the basis of specific embodiments, numerous variations and alternative embodiments can be deduced by the person skilled in the art, e.g. by combination and/or exchange of features of individual embodiments. Accordingly, it goes without saying for the person skilled in the art that such variations and alternative embodiments are also encompassed by the present disclosure, and the scope of the disclosure is only restricted within the meaning of the accompanying patent claims and the equivalents thereof.

What is claimed is:

1. An optical system, comprising:
    an image rotator in the optical system, the image rotator being configured so that at least partially polarized light impinges on the image rotator during use of the optical system,
    wherein:
        for the at least partially polarized light that impinges on the image rotator, the image rotator rotates an intensity distribution of the light through an angle of rotation;
        for the at least partially polarized light that impinges on the image rotator, the image rotator rotates a polarization distribution of the light through the angle of rotation;
        the image rotator comprises at least two beam deflecting optical elements which are adjustable with respect to each other to change the angle of rotation; and
        the optical system is configured to be used in a microlithographic projection exposure apparatus.

2. The optical system according to claim 1, wherein:
    the at least partially polarized light that impinges on the image rotator has an at least approximately tangential polarization distribution; or
    the at least partially polarized light that impinges on the image rotator has an at least approximately radial polarization distribution.

3. The optical system according to claim 1, wherein an illumination setting in the optical system is a dipole illumination setting or a quadrupole illumination setting.

4. The optical system according to anyone of the claims 1, wherein:
    the optical system comprises a diffractive optical element; and
    the image rotator is arranged, in a light propagation direction, directly subsequent to the diffractive optical element.

5. The optical system according to claim 1, wherein the at least partially polarized light that impinges on the image rotator has an angular spectrum in which a maximum aperture angle of an entering light bundle at the location of the image rotator is not more than 5°.

6. The optical system according to claim 1, wherein the image rotator is arranged in a pupil plane of the optical system.

7. The optical system according to claim 1, wherein the image rotator is arranged in a field plane of the optical system.

8. The optical system according to claim 1, wherein at least one of the at least two beam deflecting optical elements is a prism.

9. The optical system according to claim 8, wherein the prism comprises a cubic crystalline material.

10. The optical system according to claim 9, wherein a crystal orientation of the cubic crystalline material is such that a light beam which is refracted when it enters the prism propagates either in the <100>-direction of the cubic crystalline material or in the <111>-direction of the cubic crystalline material.

11. The optical system according to claim 1, further comprising a device configured to exchange the image rotator.

12. An apparatus, comprising:
    an illumination system; and
    a projection objective,
    wherein the apparatus is a microlithographic projection exposure apparatus, and
    wherein the illumination system and/or the projection objective comprises an optical system according to claim 1.

13. The apparatus according to claim 12, wherein the projection objective has a numerical aperture of more than 0.85.

14. The apparatus according to claim 12, wherein the apparatus is configured to operate in an immersion mode.

15. A method, comprising:
    providing a microlithographic projection exposure apparatus; and
    using the microlithographic projection exposure apparatus to project at least part of a mask onto a region of a light sensitive layer on a substrate, thereby providing a microstructured component,
    wherein:
        the microlithographic projection exposure apparatus comprises an illumination system and projection objective; and
        the illumination system and/or the projection objective comprises an optical system according to claim 1.

16. An illumination system, comprising:
    an image rotator configured so that, for light impinging on the image rotator, the image rotator rotates an intensity distribution of the light through an angle of rotation and the image rotator rotates a polarization distribution of the light through the angle of rotation,
    wherein the image rotator comprises at least two beam deflecting optical elements which are adjustable with respect to each other to change the angle of rotation, and
    wherein the illumination system is configured to be used in a microlithographic projection exposure apparatus.

17. An apparatus, comprising:
an illumination system; and
a projection objective, wherein the apparatus is a microlithographic projection exposure apparatus, and the illumination system is configured in accordance with claim 16.

18. An optical system, comprising:
an image rotator in the optical system, the image rotator being configured so that at least partially polarized light impinges on the image rotator during use of the optical system,
wherein:
- for the at least partially polarized light that impinges on the image rotator, the image rotator rotates an intensity distribution of the light through an angle of rotation;
- for the at least partially polarized light that impinges on the image rotator, the image rotator rotates a polarization distribution of the light through the angle of rotation;
- the image rotator is arranged in a field plane of the optical system; and
- the optical system is configured to be used in a microlithographic projection exposure apparatus.

* * * * *

UNITED STATES PATENT AND TRADEMARK OFFICE
CERTIFICATE OF CORRECTION

| | | |
|---|---|---|
| PATENT NO. | : 8,593,618 B2 | Page 1 of 1 |
| APPLICATION NO. | : 12/971798 | |
| DATED | : November 26, 2013 | |
| INVENTOR(S) | : Michael Totzeck | |

It is certified that error appears in the above-identified patent and that said Letters Patent is hereby corrected as shown below:

In the Specification:

Col. 2, line 33, delete "away" and insert -- a way --.

In the Claims:

Col. 10, line 1, in Claim 4, delete "anyone of the claims" and insert -- claim --.

Signed and Sealed this
Twenty-fifth Day of March, 2014

Michelle K. Lee
*Deputy Director of the United States Patent and Trademark Office*